United States Patent [19]
Tan et al.

[11] Patent Number: 5,596,595
[45] Date of Patent: Jan. 21, 1997

[54] CURRENT AND HEAT SPREADING TRANSPARENT LAYERS FOR SURFACE-EMITTING LASERS

[75] Inventors: Michael R. T. Tan, Menlo Park; Yu-Min Houng, Cupertino; Shih-Yuan Wang, Palo Alto, all of Calif.

[73] Assignee: Hewlett-Packard Company, Palo Alto, Calif.

[21] Appl. No.: 486,008

[22] Filed: Jun. 8, 1995

[51] Int. Cl.$^6$ ............................... H01S 3/08; H01S 3/04; H01S 3/18
[52] U.S. Cl. .................................... 372/96; 372/34
[58] Field of Search ..................... 372/96, 34, 46

[56] References Cited

U.S. PATENT DOCUMENTS

| | | | |
|---|---|---|---|
| 5,245,622 | 9/1993 | Jewell et al. | 372/45 |
| 5,266,503 | 11/1993 | Wang et al. | 437/24 |
| 5,293,392 | 3/1994 | Shieh et al. | 372/96 |
| 5,317,587 | 5/1994 | Ackley et al. | 372/96 |
| 5,343,487 | 8/1994 | Scott et al. | 372/46 |
| 5,359,618 | 10/1994 | Lebby et al. | 372/45 |
| 5,422,901 | 6/1995 | Lebby et al. | 372/46 |
| 5,442,203 | 8/1995 | Adomi et al. | 372/96 |

*Primary Examiner*—Rodney B. Bovernick
*Assistant Examiner*—Robert McNutt

[57] ABSTRACT

A surface-emitting laser includes optically transparent layers on a side of a DBR mirror structure that is opposite to an optical cavity of the laser. In one embodiment, the transparent layer is a heat-conducting layer that has an efficient heat transfer relationship with an opening in a top electrode and with a heat-spreading layer. The heat-spreading layer increases the diameter of the electrode, so as to reduce the thermal impedance of the surface-emitting laser. The heat-spreading layer may be annular in shape and may have an inside diameter that is less than the outside diameter of the electrode, allowing the heat-spreading layer to first overlap the electrode and then overlap the portion of the heat-conducting layer that resides on the inside portion of the electrode. In another embodiment, the optically transparent layer is positioned between the top electrode and the top DBR mirror structure of the surface-emitting laser. In this embodiment, the transparent layer is a current-spreading layer that reduces the lateral resistance of the laser. Lateral resistance is reduced by providing a layer having a thickness of one-half of the wavelength of the light energy generated in the laser times an odd multiple greater than one. Optionally, two half-wavelength layers may be formed between the electrode and the mirror structure, with the upper layer being selected primarily for its electrical properties and the lower layer being selected primarily for its optical properties.

19 Claims, 2 Drawing Sheets

CURRENT AND HEAT SPREADING TRANSPARENT LAYERS FOR SURFACE-EMITTING LASERS

TECHNICAL FIELD

The present invention relates generally to semiconductor lasers and more particularly to improving current and/or heat spreading for surface-emitting lasers.

BACKGROUND ART

Semiconductor lasers may be used in a wide variety of applications, such as for providing high-speed optical data links or for connecting workstations, peripherals and displays. In many applications, surface-emitting lasers provide a number of advantages over conventional edge-emitting lasers. The advantages include: (1) the devices are completed at a wafer level and therefore can be completely characterized; (2) the numerical aperture is smaller and symmetrical, allowing a highly efficient coupling to an optical fiber; (3) operation is single-frequency; and (4) the devices can be relatively easily integrated with monitor photodiodes or transistors, or may be integrated in two-dimensional arrays of surface-emitting lasers.

For a surface-emitting laser, radiation is typically emitted through one or more openings in a metal electrode of the laser. This arrangement is particularly advantageous if the light emitted from an opening is to be coupled to a single mode optical fiber. The shape and size of the opening through which light is coupled to the optical fiber can be made to conform to the shape and size of the fiber. On the other hand, light emitted from an edge-emitting laser is typically radiated from an elongated area, so that laser-to-fiber coupling is less efficient.

A surface-emitting laser is described in U.S. Pat. No. 5,266,503 to Wang et al., which is assigned to the assignee of the present invention. An opening in the electrode layer of Wang et al. is aligned with an electrically insulating region that may be formed by oxygen ion implantation. The region of implantation confines current flow from the electrode to a selected region of an active layer in which light energy is generated at a fixed wavelength in response to the current flow. The electrode and the current-confinement region may have a concentric arrangement.

Two concerns in the design and operation of a surface-emitting laser are the distribution of thermal energy and the distribution of current flow. These concerns are somewhat interrelated. A high thermal impedance will adversely affect performance of the laser. Current from the annular electrode is injected through a distributed Bragg reflector (DBR) mirror structure in which each layer has a thickness of one-quarter wavelength of the frequency of generated light propagating through the layers of the laser. In many cases, the one-quarter wavelength layers are too thin to handle the large current densities, e.g. 10–20 $KA/cm^2$ injected into the mirror structure. This results in light output degradation and in a reduced useful life of the laser. A vertical cavity top-emitting laser is particularly susceptible to such problems. The uppermost layer is almost degenerately doped in order to reduce the contact resistance of the metal electrode. Since the layer is thin, it is susceptible to excessive heating that will result in burn-out.

U.S. Pat. No. 5,343,487 to Scott et al. describes a vertical cavity surface-emitting laser (VCSEL) that addresses the issue of current crowding, i.e. a non-uniform current distribution. In one embodiment, a contacting region is formed between an electrode and an active region of the VCSEL. The contacting region is provided with a layered section that is radially graded in resistivity, so as to restrict the current injection to a radius less than that of the resonant cavity of the laser. U.S. Pat. No. 5,245,622 to Jewell et al. describes a VCSEL that positions a stratified electrode between the active region of the laser and an upper DBR mirror structure. The stratified electrode comprises pairs of high doped and low doped layers having a conductivity type selected for injecting current into the active region of the laser. The thickness of the high doped layers is approximately equal to or less than one-quarter of the wavelength of emitted radiation. Likewise, the thickness of the low doped layers is approximately equal to or greater than one-quarter of the wavelength, with the total thickness of a pair being one-half wavelength. While use of the Scott et al. and Jewell et al. teachings provides improvements over previous laser structures, further improvements are desired.

What is needed is a surface-emitting laser that further improves current and/or heat distribution without adversely affecting the performance of the laser.

SUMMARY OF THE INVENTION

A surface-emitting laser is formed to include layers for improving the heat spreading and current spreading capabilities of the laser. Layers that reduce the thermal impedance or improve the current distribution are added in order to improve performance and/or increase the useful life of the surface-emitting laser. The layers are formed to allow passage of light energy from the optical cavity of the laser through an opening in an electrode.

In a first embodiment, thermal impedance is reduced by forming a heat-conducting layer in the opening through the electrode. In order to minimize the effects of the heat-conducting layer on the optical performance of the laser, the heat-conducting layer has a preferred thickness that is an integer multiple of one-half of the wavelength of light energy generated in the laser cavity. A heat-spreading layer is then formed to be in electrical contact with the electrode and in thermal contact with the heat-conducting layer. The electrode and the heat-spreading layer may each have an annular configuration, with the outside diameter of the electrode being greater than the inside diameter of the heat-spreading layer but less than the outside diameter of the heat-spreading layer. Thus, the heat-spreading layer partially overlaps the coaxial electrode.

The heat-conducting layer covers the opening of the electrode and preferably extends onto the electrode. Thermal energy generated by the laser may then be channeled to the heat-spreading layer via the heat-conducting layer, providing a greater distribution of thermal flow and reducing the thermal impedance of the laser.

The heat-conducting layer that is formed in the opening of the electrode should be optically transparent to the radiated light and should have a high thermal conductivity. Silicon carbide having a thickness of one-half of the wavelength of the light is a preferred structure, but other materials may be substituted, e.g. diamond. Optionally, the thickness may be an odd multiple of one-quarter of the wavelength of the light, if the heat-conducting layer is paired with a distributed Bragg reflector (DBR) layer that allows the heat-spreading layer to also function as a layer in a DBR mirror structure. As set forth herein, references to thickness in terms of "wavelength" should be understood to be measurements with respect to laser-generated light propagating through the laser material. This wavelength is equal to the wavelength of light emitted from the laser divided by the refractive index of the relevant material.

Regarding the heat-spreading layer, the material must have a relatively high electrical and thermal conductivity. The thickness of the heat-spreading layer is preferably greater than the thickness of the electrode, so as to efficiently distribute thermal energy generated by the surface-emitting laser.

In a second embodiment, the layer of interest is a current-spreading layer that is positioned between a top DBR mirror structure and the top electrode. This current-spreading layer has a thickness that is an integer multiple of one-half of the wavelength of the propagating light. Thus, the current-spreading layer is substantially optically transparent. The layer is at least a single-film layer, and the doping of the layer may be graded.

Since the current-spreading layer has a thickness of at least one-half wavelength, the uppermost layer of the laser is at least twice as thick as the comparable DBR layer of a conventional top-emitting laser. Conventionally, the uppermost layer is a DBR layer. By increasing the thickness of the uppermost layer, the lateral resistance is reduced, thereby providing a more uniform current injection from a top electrode. However, because the current-spreading layer is an integer multiple of one-half wavelength, the layer is transparent and will not alter the DBR reflectivity of the quarter-wave mirror layers.

Optionally, more than one half-wave layer may be added between the DBR mirror structure and the top electrode. For example, a first half-wave layer may be formed based upon its bandgap with respect to the emitted radiation, while an upper half-wavelength layer may be selected primarily for its electrical properties. This reduces the effect of any tradeoff that may be present in selecting a low resistance layer (i.e., highly doped layer) in order to maximize current spreading and selecting a layer because it has a low optical absorbency. An acceptable embodiment would be a lower half-wavelength layer of AlGaAs and an upper half-wavelength layer of GaAs having a graded concentration of dopant, e.g., carbon.

BEST MODE FOR CARRYING OUT THE INVENTION

Figure 1:
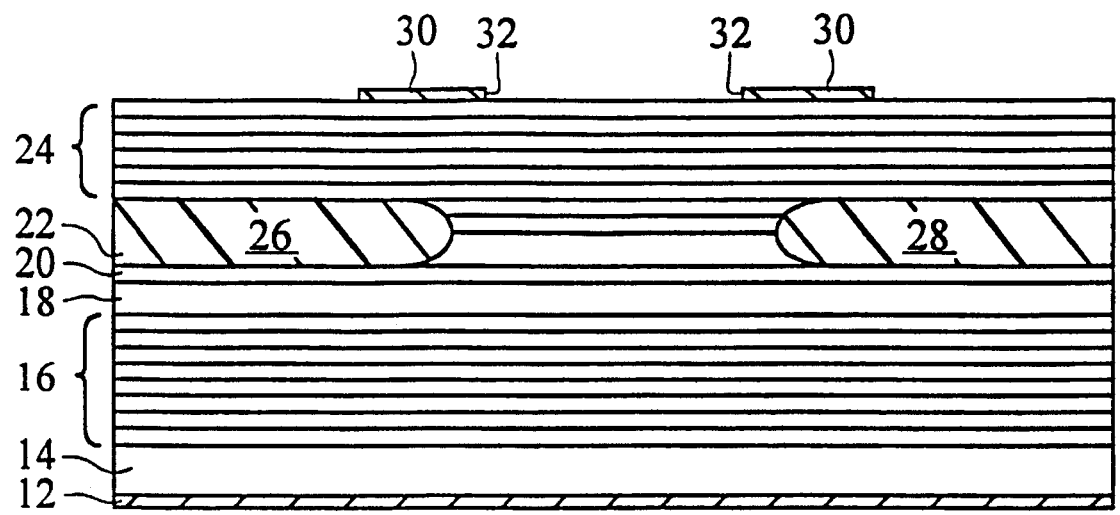
FIG. 1 is a side view of a prior art surface-emitting laser.

With reference to FIG. 1, a prior art surface-emitting laser (SEL) 10 is shown as including a lower electrode 12 on a surface of a semiconductor substrate 14. The substrate may be an n-type gallium arsenide (GaAs) substrate. The lower electrode forms an ohmic contact to the substrate and is typically an AuGe alloy.

On the surface of the substrate 14 opposite to the electrode 12 is a bottom mirror structure 16. An acceptable structure is one in which distributed Bragg reflector layers alternate between n-type GaAs and AlAs mirror quarter-wavelength layers. While eight layers are shown in FIG. 1, typically the bottom mirror structure 16 includes more layers, e.g. 32.5 pairs.

Above the bottom mirror structure 16 is a spacer layer 18, or cladding layer. An AlGaAs cladding layer having n-type dopant may be used as a layer for confining carriers within an active layer 20. The active layer is sandwiched between the spacer layer 18 and an upper spacer layer 22. The upper spacer layer is formed of the same materials as the lower spacer layer 18, but has an opposite doping type.

The spacer layers 18 and 22 and the active layer 20 form an optical cavity from which light energy is transmitted in response to current flow. The frequency of the light depends upon a number of factors, including the selected material for forming the active layer 20.

A top mirror structure 24 is formed on a side of the optical cavity opposite to the bottom mirror structure 16. The top mirror structure is also formed of an alternating pattern of GaAs and AlAs layers, but the doping type of the top mirror layer is opposite to the doping type of the bottom mirror layers. The interface between GaAs and AlAs in the distributed Bragg reflector mirrors may be graded, but this is not critical. Grading reduces the bandgap discontinuity and lowers the mirror resistance. Preferably, the mirror layers are highly doped in order to further reduce the resistivity. The GaAs and AlAs Bragg mirrors may be uniformly doped to $1 \times 10^{18}/cm^3$, except for the grading region, where the doping is higher, e.g. $5 \times 10^{18}$. The n dopant may be silicon and the p dopant may be carbon, which has been shown not to significantly diffuse out of the graded region.

Buried in the SEL are current-confinement regions 26 and 28. These regions may be formed by implanting oxygen ions, as described in U.S. Pat. No. 5,266,503 to Wang et al., which is assigned to the assignee of the present invention. However, other techniques for forming these regions may be employed. A top electrode 30 is positioned to conduct electrical current to the top mirror structure 24. The top electrode has an inner wall 32 that defines a central opening through which light is emitted. The electrode may have an annular shape, so that the opening is circular, but this is not critical. A circular opening provides an efficient coupling of light to an optical fiber. The current-confinement regions 26 and 28 improve lasing efficiency. These regions confine current flow between the top electrode 30 and the bottom electrode 12 to a relatively small area of the active layer 20. Conventionally, the current-confinement regions 26 and 28 define a circular opening that is aligned with the opening of the top electrode 30.

In operation, a bias voltage is applied across the bottom and top electrodes 12 and 30. The current-confinement regions 26 and 28 constrains the current flow to the active layer 20 and the spacer layers 18 and 22, via the relatively small circular opening through the lower layers of the top mirror structure 24. While this arrangement provides an efficient laser device, the thermal impedance of the device is a concern. Current flow through the SEL will generate light energy, but will also generate thermal energy. A portion of the heat will dissipate downwardly to the bottom electrode, which is typically in contact with a heat sink. Some portion of the heat will be conducted upwardly to the top electrode.

Figure 2:
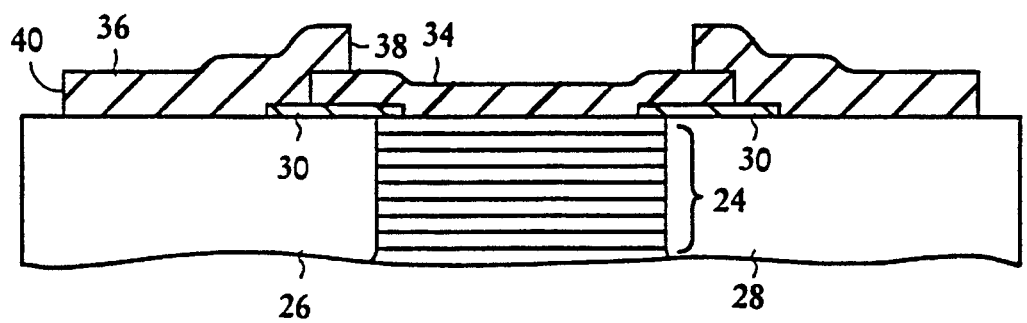
FIG. 2 is a side view of the SEL of FIG. 1 having a heat-conducting layer and a heat-spreading layer in accordance with the invention.

Referring now to FIG. 2, the present invention reduces the thermal impedance of the SEL by providing an optically transparent heat-conducting layer 34 and a heat-spreading layer 36, thereby increasing the effective radiating diameter. Thermal energy that is generated during operation of the SEL and that then moves upwardly through the top mirror structure 24 is ideally conducted through layer 34 to the heat-spreading layer 36, allowing the thermal energy to be dissipated. As a result, the thermal impedance of the SEL is reduced. As will be explained more fully below, the reduction in thermal impedance ($Z_{th}$) may be modeled by:

$$Z_{th} = \frac{1}{2\pi\sigma D/2} \arctan\left(\frac{2t}{D/2}\right)$$

where D is the diameter of the material over which the thermal energy is spread, t is the thickness of the semiconductor substrate on which the SEL is formed, and σ is the thermal conductivity of the semiconductor material from which the substrate is formed. In the prior art, the effective diameter (D) is less than that of the present invention.

Regarding the heat-conducting layer 34 that is within the opening defined by the top electrode 30, there are two properties that are of interest. First, the layer 34 should not impede the transmission of light through the electrode opening. In the preferred embodiment, the layer 34 has a thickness that is an integer multiple of one-half the wavelength of generated light propagating through the SEL. Thus, the layer 34 has a thickness that is an integer multiple of twice the thickness of a layer of the top mirror structure 24. An acceptable material for forming the heat-conducting layer is silicon carbide. However, other materials may be employed, e.g. diamond.

As an alternative, the heat-conducting layer 34 may have a thickness of one-quarter wavelength or some other odd multiple of one-quarter wavelength of the emitted light and an index of refraction that is consistent with the pattern of the top mirror structure 24. As previously noted, the top mirror structure comprises quarter-wavelength DBR mirror layers having alternating high and low indices of refraction. If the heat-conducting layer 34 fits within the pattern, it may have a thickness of one-quarter wavelength or some other odd multiple of one-quarter wavelength, rather than an integer multiple of one-half wavelength.

The other important property of the heat-conducting layer 34 is thermal conductivity. The purpose of the layer 34 is to facilitate transfer of heat from the SEL to the heat-spreading layer 36. A high thermal conductivity provides an efficient transfer of heat. Silicon carbide has an acceptable thermal conductivity. Ideally, the layer 34 is also electrically conductive. However, electrically conductive materials typically do not provide the desired transparency to emitted light.

With regard to the heat-spreading layer 36, an electrically conductive material, e.g. plated gold, is preferred, since it allows the layer 36 to be used to apply a signal to the top electrode 30. As shown in FIG. 2, the outside diameter of the top electrode is between the inside diameter 38 and the outside diameter 40 of the heat-spreading layer. While an annularly shaped heat-spreading layer is not critical to the invention, the annular shape is preferred since it provides a generally uniform distribution of heat.

In the embodiment of FIG. 2, the heat-conducting layer 34 overlaps a portion of the top electrode 30. The exposed portion of the top electrode is in contact with the heat-spreading layer. A portion of the thermal energy from the top mirror structure 24 will be conducted from the layer 34 to the layer 36. On the other hand, electrical energy may be channeled in the opposite direction from the heat-spreading layer 36 to the top electrode 30 for inducing a current through the top mirror structure 24.

An accurate modeling of the thermal impedance is provided by the equation:

$$Z_{th} = \frac{1}{2\pi\sigma D/2} \arctan\left(\frac{2t}{D/2}\right)$$

Thus, thermal impedance can be reduced by reducing the thickness (t) of the semiconductor substrate (GaAs). However, the improved thermal impedance is necessarily accompanied by a greater susceptibility to wafer breakage. In practice, the lower limit of wafer thickness is approximately 100 μm. The present invention allows further reduction in thermal impedance by increasing D, i.e. the dimension parallel with the surface of the SEL along which thermal energy is spread. Here, because the outside diameter 40 of the heat-spreading layer 36 is greater than the outside diameter of the top electrode 30, the thermal impedance is reduced.

The dimension D may be increased by plating additional gold to the SEL, thereby forming the heat-spreading layer. The parameters of the plating process are known in the art. While gold is the preferred material, other conductive materials may be substituted as the means for promoting the spread of thermal energy.

While the invention of FIG. 2 has been described and illustrated as being used with a top-emitting SEL, this embodiment operates equally well for bottom-emitting SEL devices. Moreover, while the embodiment of FIG. 2 shows the current-confinement regions 26 and 28 as extending to the top surface of the SEL, this is not critical. The reduction in thermal impedance may also be achieved in use with an SEL in which the current-confinement regions are buried or are on a side of the optical cavity opposite to the electrode having the opening for the emission of light.

Referring again to FIG. 1, in a vertical cavity SEL 10, electrical current is injected through the quarter-wave DBR layers of the mirror structure 24. In many applications, the quarter-wave layers are too thin to reliably handle the large current densities, e.g. 10–20 KA/cm$^2$, injected into the laser. This results in premature device burnout and light output degradation. The concern is particularly great for top-emitting SELs, wherein electrical current is injected through an annular electrode 30 which allows the light to exit the laser.

The uppermost layer of the mirror structure 24 is conventionally almost degenerately doped in order to reduce the contact resistance of the metal electrode 30. If the layer is too thin, excessive heating will result. It is this excessive heating that causes premature burnout of the electrode and the top surface layer, resulting in damage to the laser.

Figure 3:
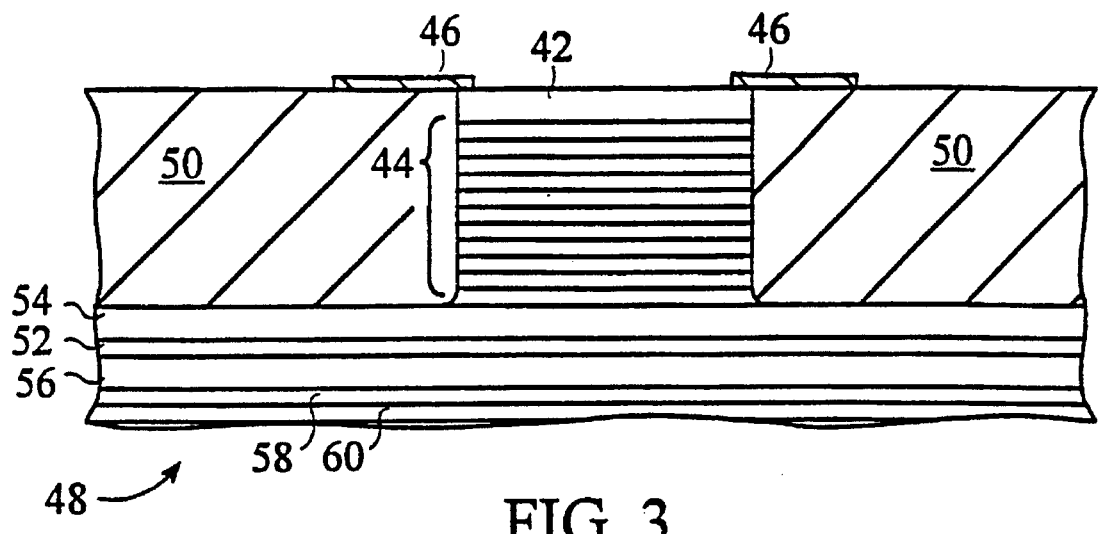
FIG. 3 is a side view of an SEL having a current-spreading layer between a top mirror structure and a top electrode in accordance with a second embodiment of the invention.

Referring now to FIG. 3, the susceptibility to excessive heating is reduced by incorporating a current-spreading layer 42 between a top mirror structure 44 and an annular top electrode 46. In FIG. 3, the current-spreading layer 42 is shown as being used with an SEL 48 having an implant region 50 for confining electrical current. With the exception of the current-spreading layer 42 and the region 50 that extends to the surface, the SEL 48 is similar to prior art lasers. Below the top mirror structure 44 is an active layer 52 sandwiched between spacer layers 54 and 56. Also shown in FIG. 3 are the top two layers 58 and 60 of a bottom mirror structure.

By increasing the thickness of the uppermost layer of the SEL 48, the lateral resistance is reduced. As a consequence, there is a more uniform current injection from the ring electrode 46. However, merely increasing the thickness will not provide a more desirable structure. The thickness of the current-spreading layer 42 must be selected so as not to compromise the reflectivity of the DBR mirror structure 44. By forming the layer 42 to have a thickness that is an integer multiple of a half wavelength of the light energy generated at the active layer 52, the current-spreading layer is optically transparent to the emitted light and will not alter the DBR reflectivity of the quarter-wave layers of the mirror structure.

In the preferred embodiment, the half-wave current-spreading layer 42 has a high thermal conductivity and a low electrical resistivity. Electrical current and thermal energy are therefore easily exchanged between the mirror structure 44 and the current-spreading layer. As previously noted, the thickness is an integer multiple of one-half of the wavelength of emitted light. An acceptable current-spreading layer is a half-wavelength thick layer of highly doped GaAs. Carbon may be used as the dopant, with the concentration being approximately $5 \times 10^{19} cm^3$. The concentration may be graded in order to reduce associated free-carrier loss and to improve laser performance.

Figure 4:
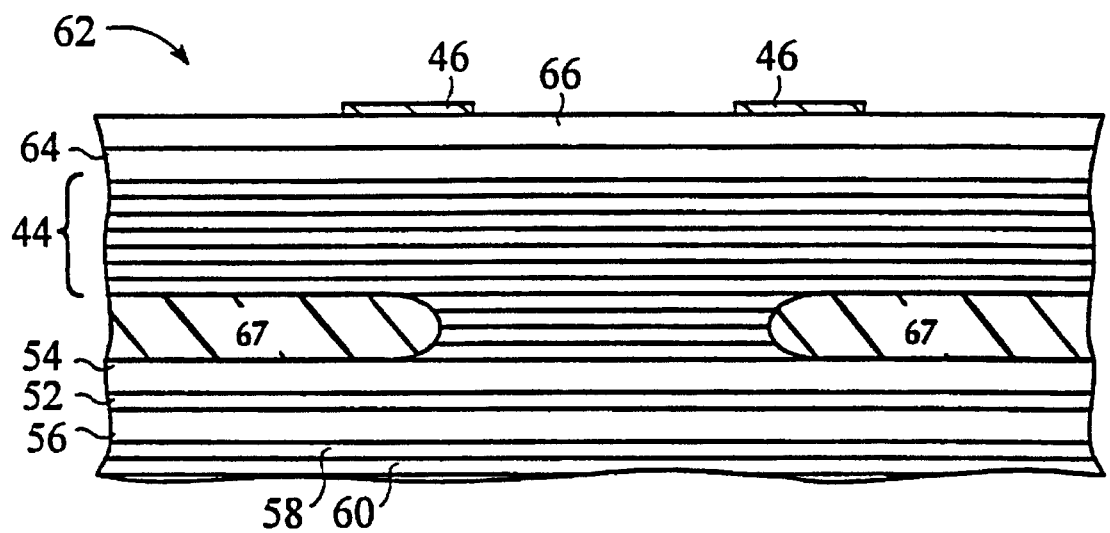
FIG. 4 is a side view of an alternative to the embodiment of FIG. 3, with upper and lower current-spreading layers.

FIG. 4 is a third embodiment of the invention. In this embodiment, the SEL 62 includes a lower current-spreading layer 64 and an upper current-spreading layer 66. For the purpose of clarity, the elements of the embodiment of FIG. 4 that are duplicates of the elements of the embodiment of FIG. 3 are provided with identical reference numerals. Thus, the current-spreading layers 64 and 66 are positioned below an annular top electrode 46 and above a mirror structure 44. An active layer 52 and spacer layers 54 and 56 form an optical cavity for the generation of light energy. In FIG. 4, the current-confining region 67 is shown as being buried, but this is not critical.

Each of the current-spreading layers 64 and 66 has a thickness that is an integer multiple of one-half of the wavelength of the light generated by the SEL.

The upper current-spreading layer 66 may be selected primarily for its electrical properties, while the lower current-spreading layer 64 may be selected primarily for its optical properties. For example, the upper layer 66 may be a GaAs layer that is epitaxially grown to a thickness of one-half wavelength, with an upper region having a dopant concentration of approximately $1.0 \times 10^{19}$ cm$^3$ and a lower region having a dopant concentration of $5 \times 10^{18}$ cm$^3$. The lower layer 64 may then be an AlGaAs layer that is epitaxially grown to a thickness of one-half wavelength. The GaAs layer is selected for its ability to be more highly doped, but is optically absorbing at the emission wavelength. Thus, to minimize the degree of absorption, the lower layer is selected to be formed of AlGaAs, which has a higher bandgap with respect to the emitted radiation, so that it is more transparent and can still be highly doped. In some applications, additional layers, each having a thickness that is an integer multiple of a half wavelength, may provide advantages (e.g., further reduction in series resistance) when placed between the top electrode 46 and the top mirror structure 44.

While the invention of FIGS. 3 and 4 has been described as having current-spreading layers 42, 64 and 66 for which each has a thickness that is an integer multiple of a half wavelength, in some applications of the invention it may be beneficial to include a highly conductive layer that (1) is degenerately doped and/or has a low bandgap, thereby reducing the contact resistance at the interface with the electrode and (2) is so thin that the current-spreading layer remains approximately equal to the integer multiple of a half wavelength, so that radiation loss resulting from inclusion of the highly conductive layer is not substantial. Such radiation loss can be reduced, or perhaps eliminated, by removing the portion of the layer that is exposed by the opening through the electrode. For example, the electrode may be as a mask in an etch step for removing the exposed region of the highly conductive layer. This approach of material-removal in order to minimize radiation loss applies equally well to the highly doped upper layer of FIG. 4. That is, the region of layer 66 that is exposed by the opening through electrode 46 may be removed to reduce loss, while maintaining the benefits of having an upper layer 66 for which the electrical conductivity is greater than the more transmissive lower layer 64.

Figure 5:
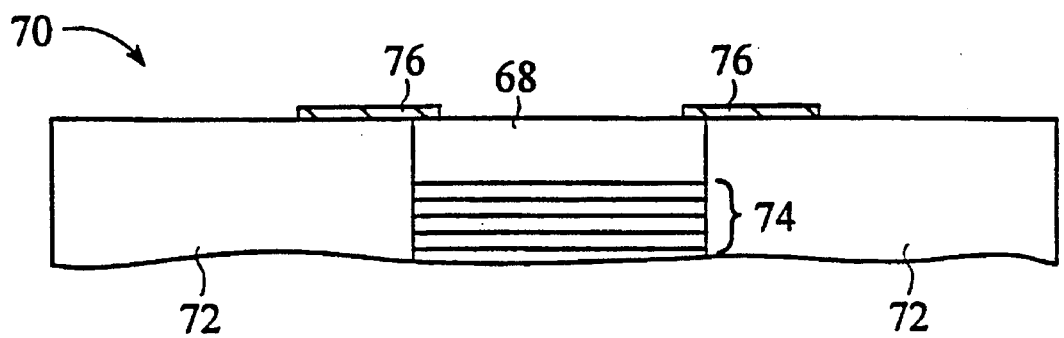
FIG. 5 is a side view of another alternative to the embodiment of FIG. 3.

FIG. 5 is another embodiment of the use of a current-spreading layer 68 to reduce lateral resistance and increase the useful life of the SEL 70. In this embodiment, the current-spreading layer is a full wavelength of the light generated within the layer. Consequently, lateral resistance is reduced even further. Optionally, the thickness of layer 68 can be 1.5 wavelengths or some other multiple of a half-wavelength, since such a layer would be optically transparent and would provide enhanced current spreading. As yet another alternative, the current-spreading layer 68 could have a thickness that is an odd multiple of one-quarter of the wavelength of interest, with the odd multiple being greater than one. Within this last alternative, the layer 68 would necessarily have an index of refraction that would continue the pattern of alternating indices established within the mirror structure 74.

In FIG. 5, the implant region 72 that establishes current confinement is shown as extending to the surface of the SEL, but this is not critical. It should be noted that in the same manner as the embodiments of FIGS. 3 and 4, the current-spreading layer 68 is positioned between the top mirror structure 74 and a top electrode 76.

Another embodiment would be one in which the current-spreading layer 42 of FIG. 3 is used with an SEL in which the implant region 50 is below the optical cavity formed by the active layer 52 and the spacers layers 54 and 56. The benefits of the current-spreading layer would still be realized. Yet another embodiment would be to combine the current-spreading layer 42 of FIG. 3 with the heat-conducting layer 34 and the heat-spreading layer 36 of FIG. 2.

While the current-confinement layer has been described as being formed by ion implantation, other techniques may be used. For example, techniques for forming etched mesas, native oxides or regrowth regions may be employed. If ion implantation is selected for forming the current-confinement layer, oxygen and helium are included as acceptable substitutes for hydrogen as a source of ions.

We claim:

1. A surface-emitting laser comprising:
   an optical cavity having an active layer in which light energy is generated at a substantially fixed wavelength in response to electrical current flow;
   a first plurality of layers having alternating indices of refraction, said first plurality of layers being on a first side of said optical cavity;
   a second plurality of layers having alternating indices of refraction, said second plurality of layer being on a second side of said optical cavity opposite to said first side;
   a first electrode on a side of said first plurality of layers opposite to said optical cavity, said first electrode having an opening for passage of said light energy;

a second electrode on a side of said second plurality of layers opposite to said optical cavity;

a heat-conducting layer formed in said opening of said first electrode, said heat-conducting layer having a lateral extent that is greater than a lateral extent of said opening in said first electrode, said heat-conducting layer extending over said first electrode and contacting at most a portion of a surface of said first electrode, thereby leaving a portion of said surface exposed; and an electrically conductive heat-spreading layer having a lateral extent that exceeds a lateral extent of said first electrode, said heat-spreading layer overlapping both said exposed surface of said first electrode and a portion of a surface of said heat-conducting layer, thereby being in electrical contact with said first electrode and in thermal contact with said heat-conducting layer;

wherein said first plurality of layers and said heat-conducting layer have optical properties to permit transmission of said light energy through said opening of said first electrode.

2. The surface-emitting laser of claim 1 wherein said heat-conducting layer is a single layer of material having a thickness that is substantially an integer multiple of one-half of said wavelength of light energy generated at said active layer.

3. The surface-emitting laser of claim 1 wherein said heat-conducting layer is a single layer of material having a thickness that is substantially an odd multiple of one-quarter of said wavelength of light energy generated at said active layer, said heat-conducting layer contacting said first plurality of layers and maintaining a pattern of alternating indices of refraction of said first plurality of layers.

4. The surface-emitting laser of claim 1 wherein said opening of said first electrode defines an optically exposed region of said first plurality of layers, said heat-conducting layer completely covering said optically exposed region and extending onto said first electrode.

5. The surface-emitting laser of claim 1 wherein said first electrode and said heat-spreading layer are metallic layers, said heat-spreading layer having a thickness greater than a thickness of said first electrode.

6. The surface-emitting laser of claim 1 wherein said first electrode and said heat-spreading layer are substantially coaxial and have generally annular shapes, said first electrode having an outside diameter that is greater than an inside diameter of said heat-spreading layer and less than an outside diameter of said heat-spreading layer, thereby establishing an arrangement in which said heat-spreading layer partially overlaps said electrode and extends radially beyond said electrode.

7. The surface-emitting laser of claim 6 wherein said heat-conducting layer extends outwardly from said opening of said first electrode and is partially overlapped by said heat-spreading layer.

8. The surface-emitting laser of claim 1 wherein said heat-conducting layer is formed of one of silicon carbide and diamond.

9. A method of fabricating a surface-emitting laser comprising the steps of:

forming a plurality of layers to define an optical cavity having an active layer in which light energy is generated at a substantially fixed wavelength in response to electrical current flow, forming said plurality of layers further including forming first and second patterns of mirror layers on the opposed sides of said optical cavity;

forming a first electrode on said first pattern of mirror layers such that said first electrode includes an opening for transmitting said light energy from said optical cavity;

forming a thermally conductive layer to cover said opening while permitting passage of said light energy, said thermally conductive layer having a thickness that is an integer multiple of one-quarter of said wavelength of said light energy, said thermally conductive layer extending over said first electrode and contacting at most a portion of a surface of said first electrode, thereby leaving a portion of said surface exposed; and forming a conductive heat-spreading layer, said heat-spreading layer extending beyond the lateral extent of said thermally conductive layer and said first electrode, said heat-spreading layer overlapping both said exposed surface of said first electrode and a portion of a surface of said thermally conductive layer, thereby being in thermal contact with said thermally conductive layer and in electrical contact with said first electrode; and forming a second electrode on said second pattern of mirror layers.

10. The method of claim 9 wherein said step of forming said heat-spreading layer provides a thickness greater than said first electrode.

11. The method of claim 10 wherein said step of forming said heat-spreading layer includes at least partially overlapping said first electrode.

12. The method of claim 9 wherein said steps of forming said heat-spreading layer and said first electrode define annular shapes in which said heat-spreading layer has an outside diameter greater than an outside diameter of said first electrode.

13. The method of claim 9 wherein said step of forming said thermally conductive layer is a step of forming an optically transparent layer having a thickness that is an integer multiple of one-quarter of said wavelength.

14. A surface-emitting laser comprising:

an optical cavity having an active layer in which light energy is generated at a substantially fixed wavelength in response to electrical current flow;

a top mirror and a bottom mirror on opposed sides of said optical cavity, said top mirror and said bottom mirror each having a plurality of quarter wavelength thick layers having alternating indices of refraction;

a current-spreading layer on a side of said top mirror opposite to said optical cavity, said current-spreading layer having a thickness that is approximately equal to one-quarter of said wavelength times an integer multiple greater than one, said current-spreading layer being substantially optically transparent and being electrically conductive;

a top electrode formed on a side of said current-spreading layer opposite to said top mirror, said top electrode having a configuration to define an opening for passage of said light energy generated at said optical cavity; and a bottom electrode on a side of said bottom mirror opposite to said optical cavity.

15. The surface-emitting laser of claim 14 further comprising a second current-spreading layer between said top electrode and said current-spreading layer, said second current-spreading layer having a thickness that is an integer multiple of one-half of said wavelength, said second current-spreading layer having a greater electrical conductivity than said current-spreading layer that is closer to said top mirror.

16. The surface-emitting laser of claim 14 wherein said opening of said top electrode is generally aligned with an opening of a current confinement implant that is between said current-spreading layer and said optical cavity.

17. The surface-emitting laser of claim 14 wherein said current-spreading layer has a thickness that is an integer multiple of one-half of said wavelength.

18. A surface-emitting laser comprising:

an optical cavity having an active layer in which light energy is generated at a substantially fixed wavelength in response to electrical current flow;

a top mirror and a bottom mirror on opposed sides of said optical cavity;

a current-spreading layer on a side of said top mirror opposite to said optical cavity, said current-spreading layer having a thickness that is approximately equal to one-quarter of said wavelength times an integer multiple greater than one, said current-spreading layer being a single layer having a dopant having a graded concentration along said thickness, said current-spreading layer being substantially optically transparent and being electrically conductive;

a top electrode formed on a side of said current-spreading layer opposite to said top mirror, said top electrode having a configuration to define an opening for passage of said light energy generated at said optical cavity; and a bottom electrode on a side of said bottom mirror opposite to said optical cavity.

19. A surface-emitting laser comprising:

an optical cavity having an active layer in which light energy is generated at a substantially fixed wavelength in response to electrical current flow;

a top mirror and a bottom mirror on opposed sides of said optical cavity;

a current-spreading layer on a side of said top mirror opposite to said optical cavity, said current-spreading layer being substantially optically transparent and being electrically conductive, said current-spreading layer having a thickness that is approximately equal to one-quarter of said wavelength times an odd integer multiple greater than one wherein said current-spreading layer and layers of said top mirror establish a consistent pattern of alternating indices of refraction;

a top electrode formed on a side of said current-spreading layer opposite to said top mirror, said top electrode having a configuration to define an opening for passage of said light energy generated at said optical cavity; and a bottom electrode on a side of said bottom mirror opposite to said optical cavity.

* * * * *